United States Patent [19]

Queen et al.

[11] Patent Number: 5,119,173
[45] Date of Patent: Jun. 2, 1992

[54] METHOD OF MAKING INTEGRATED CIRCUIT TO PACKAGE CONNECTIONS

[75] Inventors: William D. Queen, San Diego; Eugene P. Kelley, Spring Valley, both of Calif.

[73] Assignee: The United States of America as represented by the Secretary of Navy, Washington, D.C.

[21] Appl. No.: 714,813

[22] Filed: Jun. 13, 1991

Related U.S. Application Data

[62] Division of Ser. No. 557,449, Jul. 18, 1990, Pat. No. 5,061,657.

[51] Int. Cl.⁵ .................... H01L 23/02; H01L 29/28; H01L 23/48; H01L 23/28
[52] U.S. Cl. .......................................... 357/74; 357/8; 357/67; 357/72
[58] Field of Search ................... 357/74, 8, 67, 72

[56] References Cited

U.S. PATENT DOCUMENTS

| | | | |
|---|---|---|---|
| 3,946,289 | 3/1976 | Yasuda | 317/230 |
| 4,594,180 | 6/1986 | Kobayashi et al. | 252/500 |
| 4,601,849 | 7/1986 | Yata | 252/500 |
| 4,629,798 | 12/1986 | Traynor | 548/562 |
| 4,639,277 | 1/1987 | Hawkins | 148/33.3 |
| 4,761,677 | 8/1988 | Sasaki | 357/8 |
| 4,764,801 | 8/1988 | McLaughlin et al. | 357/59 |

FOREIGN PATENT DOCUMENTS

| 0144061 | 2/1989 | Japan | 357/8 |
|---|---|---|---|

*Primary Examiner*—Mark V. Prenty
*Attorney, Agent, or Firm*—Harvey Fendelman; Thomas Glenn Keough

[57] ABSTRACT

A method of making electrical connections between integrated circuit contacts (16) and package contacts (18) which are more reliable and less expensive to produce is disclosed. First, an integrated circuit (10) is positioned in the cavity (12) of a package (14). Then the contacts (16) of the integrated circuit (10) and the contacts (18) of the package (14) are covered with a layer of a non-conducting organic polymer (20). Finally, a conductive path (22) is formed between the contacts (16) of the integrated circuit (10) and the contacts (18) of the package (14). Any suitable non-conductive organic polymer (20) can be used including polyaniline, polypyrrole, polythiophene, polyacetylene, poly (p-phenylene-sulfide) and poly (2,6-dimethylhenylene-oxide). The non-conducting organic polymer (20) can be applied by any suitable technique including application as a pre-formed film, deposition by electrochemical methods or deposition by low pressure chemical vapor deposition. The polymer (20) can even be applied as a solvent reduced solution with subsequent evaporation of the solvent (curing). The conductive path (22) can be formed in the layer of non-conducting polymer (20) by any suitable method including chemical doping, focused ion beam doping, and direct ion beam doping. The device may be protected by additional layers of non-conducting polymer (24) and a cover (26).

34 Claims, 1 Drawing Sheet

METHOD OF MAKING INTEGRATED CIRCUIT TO PACKAGE CONNECTIONS

STATEMENT OF GOVERNMENT INTEREST

The invention described herein may be manufactured and used by or for the Government of the United States of America for governmental purposes without the payment of royalties thereon or therefor.

This is a division of application Ser. No. 07/557,449, filed Jul. 18, 1970 and now U.S. Pat. No. 5,061,657.

BACKGROUND OF THE INVENTION

The present invention relates to the field of microelectronic device fabrication, and more particularly to forming the conductive paths from the bonding contacts of a semiconductor integrated circuit to the contacts of the integrated circuit package.

In microelectronic device fabrication, the integrated circuit is first attached to a package cavity. The bonding contacts on the integrated circuit must then be attached to the contacts of the package in order to provide electrical connection tot he rest of the circuit. Currently, integrated circuit contacts are bonded to their package contacts by processes like compression or thermal bonding. In these processes, fine, about 0.001 inch in diameter, aluminum or gold contacts are attached to the contacts on the integrated circuit and the contacts on the package. Equipment to perform these processes is expensive and manual fabrication, which must be performed under magnification, is time consuming. Automated equipment is even more expensive.

Wire bonding is an unreliable process since the wire can be easily pulled loose from the contact or broken by mishandling, vibration or shock. Some manufacturers, in an effort to increase reliability, test each or a percentage of the wire bonds to ensure that the bond has a certain minimum bond strength. This only adds to the fabrication cost. Furthermore, the integrated circuit itself is subject to damage from midhandling, vibration or shock.

SUMMARY OF THE INVENTION

This invention is a method that solves the unreliable and expensive technique of making electrical connections between integrated circuit contacts and package contacts.

First, an integrated circuit is positioned in the cavity of a package. Then the integrated circuit and the contacts of the package are covered with a layer of a non-conducting organic polymer. Finally, a conductive path is formed between the bonding contacts of the integrated circuit and the contacts of the package.

Any suitable non-conducting organic polymer can be used including polyaniline, polypyrrole, polythiophene, polyacetylene, poly (p-phenylene-sulfide) and poly (2,6-dimethylphenylene-oxide). The non-conducting organic polymer can be applied by any sutiable technique deposition by electrochemical methods or deposition by low pressure chemical vapor deposition, or as a solvent reduced solution with subsequent evaporation of the solvent or curing.

The conductive path can be formed in the layer of non-conducting polymer by any suitable method including chemical doping, focused ion beam doping, and direct ion beam doping.

If desired the layer of non-conducting polymer containing the conductive path can be covered with another layer of non-conducting polymer. Also, a special cover can be placed over the device for added protection.

This invention is applicable to fabrication of a wide variety of microelectronic devices. It provides a method of making electrical connections between integrated circuit contacts and package contacts that is less expensive to perform, produces more reliable bonds and more firmly secures the integrated circuit to the package. Furthermore, it provides better protection from stray charges.

An appreciation of the other aims and objectives of the present invention and a more complete and comprehensive understanding of this invention may be achieved by studying the following description of a preferred embodiment and by referring to the accompanying drawings.

DETAILED DESCRIPTION OF THE PREFERRED EMBODIMENT

Figure 1:
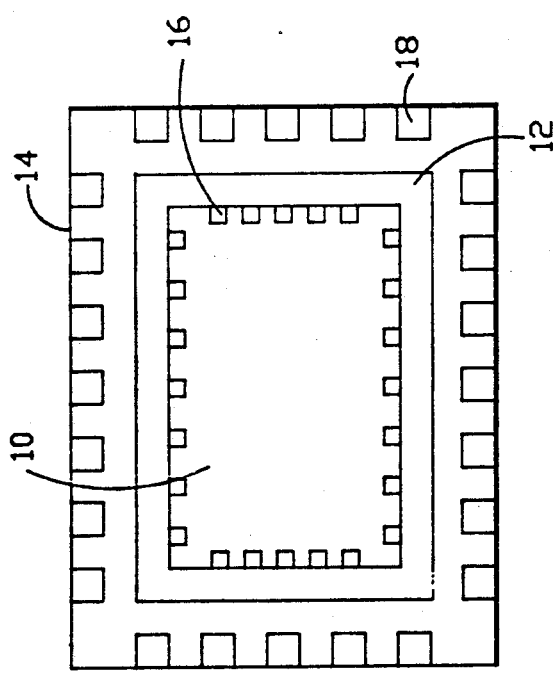
FIG. 1 is a plan view of an integrated circuit positioned on a package.

FIG. 1 shows a simple integrated circuit 10 attached to the cavity 12 of a package 14. Also shown in FIG. 1 are the contacts 16 of the integrated circuit and the contacts 18 of the package. It is through these package contacts that the integrated circuit is connected to the rest of the circuit. At this stage, the integrated circuit being fabricated in accordance with this invention looks no different that integrated circuits being fabricated by any other process. After this stage the process, covered by this invention differs from other processes. In other processes, connection is made from the contacts 16 of the integrated circuit 10 to the package contacts 18 by attaching a loop of wire.

Figure 2:
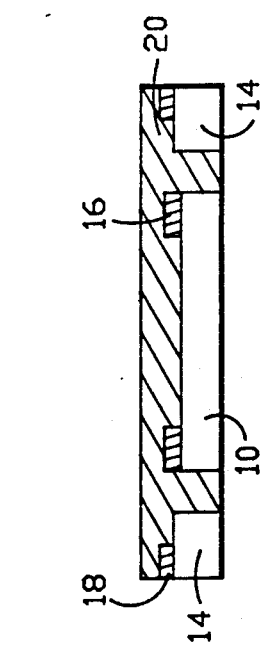
FIG. 2 is a cross-sectional view of an integrated circuit positioned on a package, covered with a layer of non-conducting organic polymer.

FIG. 2 shows the next stage in the practice of this invention, which comprises covering the integrated circuit 10 and the package contacts 18 with a layer of non-conducting organic polymer 20. Any suitable non-conducting organic polymer can be used including polyaniline, polypyrrole, polythiophene, polyacetylene, poly (p-phenylene-sulfide), a poly (2,6-dimethylphenylene-oxide). The non-conducting organic polymer 20 can be applied by any suitable technique including deposition by electrochemical methods or deposition by low pressure chemical vapor deposition. The polymer could even be applied as a solvent solution with subsequent evaporation of the solvent (curing).

Figure 3:
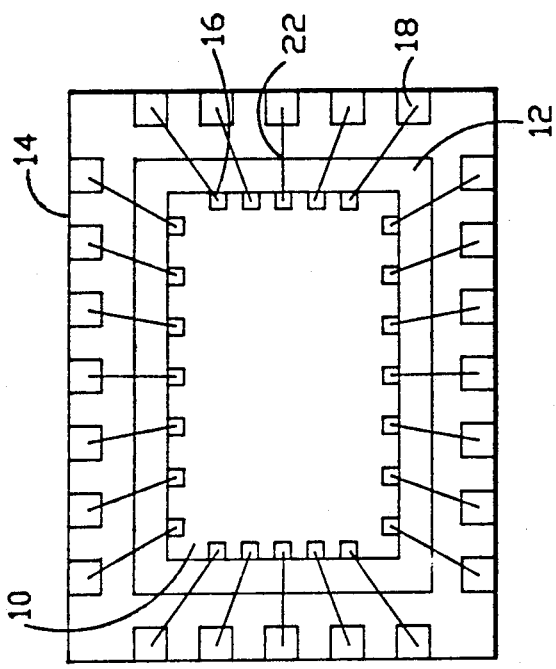
FIG. 3 is a plan view of an integrated circuit and package covered with a layer of non-conducting polymer which has had conductive paths formed between the integrated circuit contacts and the package contacts.

FIG. 3 shows the final step of forming conductive paths 22 in the layer of non-conducting organic polymer 20 between the integrated circuit contacts 16 and the package contacts 18. The conductive paths 22 can be formed in the layer of non-conducting polymer by any suitable method including chemical doping, focused ion beam doping, and direct ion beam doping.

Figure 4:
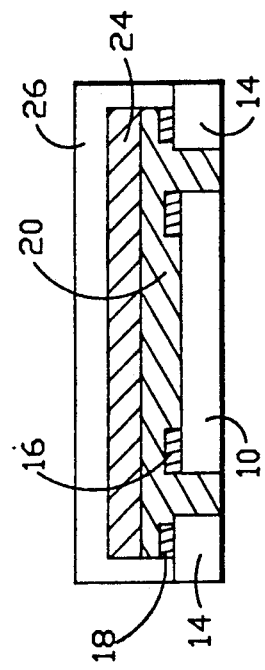
FIG. 4 is similar to FIG. 2. It shows a cross sectional view of a device of this invention fabricated with an additional layer of non-conducting polymer and a cover.

FIG. 4 shows how, in order to provide additional protection an additional layer of non-conducting organic polymer 24 can be formed on top of the layer 20 which contains the conductive paths 22. The additional layer 24 can be fabricated from any of the polymers listed above, applied by any of the methods listed above. Alternatively, or additionally, cover 26 can be attached in place over the device. If desired, it is possible to ensure that the cavity formed by the cover 26 is filled with non-conducting polymer.

This invention provides a method of making electrical connections between integrated circuit contacts and package contacts that is less expensive to perform, produces more reliable bonds and more firmly secures the integrated circuit to the package. Furthermore, it provides better protection from stray charges. This invention is applicable to fabrication of a wide variety of microelectronic devices.

Although the present invention has been described in detail with reference to a particular preferred embodiment, persons possessing ordinary skill in the art to which this invention pertains will appreciate that various modifications and enhancements may be made without departing from the spirit and scope of the claims that follow.

LIST OF REFERENCE NUMERALS

10 Integrated circuit
12 Cavity
14 Package
16 Integrated circuit contacts
18 Package bonding contacts
20 Layer of non-conducting organic polymer
22 Conductive paths
24 Additional layer of non-conducting organic polymer
Protective cover

What is claimed is:

1. An apparatus comprising:
   packaging means for providing support; said packaging means including a package and an integrated circuit; said package having a cavity area and a bonding contact; said integrated circuit having a contact;
   organic polymer means for covering said packaging means; said organic polymer means being non-conducting; and
   connective means for providing electrical coupling from said bonding contact of said package to said contact of said integrated circuit; said connective means being located within said organic polymer means.

2. The apparatus as claimed in claim 1, in which said organic polymer means is polyaniline.

3. The apparatus as claimed in claim 1, in which said organic polymer means is selected from the group consisting of polypyrrole, polythiophene, polyacetylene, poly(p-phenylene-sulfide), and poly (2,6-dimethylphenylene-oxide).

4. The apparatus as claimed in claim 1, in which said connective means in said organic polymer means is formed by chemical doping.

5. The apparatus as claimed in claim 1, in which said connective means in said organic polymer means is formed by focused ion beam doping.

6. The apparatus as claimed in claim 1, in which said connective means in said organic polymer means is formed by direct ion beam doping.

7. The apparatus as claimed in claim 1, in which said organic polymer means is electrochemically deposited.

8. The apparatus as claimed in claim 1, in which said organic polymer means is formed by low pressure chemical vapor deposition.

9. The apparatus as claimed in claim 1, in which said organic polymer means is cured, liquid, organic polymer.

10. The apparatus as claimed in claim 1, further comprising cover means for protecting said packaging means, and said organic polymer means.

11. The apparatus as claimed in claim 1, further comprising additional organic polymer means for covering said organic polymer means and said connective means.

12. The apparatus as claimed in claim 11, in which said additional organic polymer means is polyaniline.

13. The apparatus as claimed in claim 11, in which said additional organic polymer means is selected from the group consisting of polypyrrole, polythiophene, polyacetylene, poly (p-phenylene-sulfide), and poly (2,6-dimethylphenylene-oxide).

14. The apparatus as claimed in claim 11, further comprising cover means for protecting said packaging means, said organic polymer means and said additional organic polymer means.

15. The apparatus as claimed in claim 11, in which said additional organic polymer means is electrochemically deposited.

16. The apparatus as claimed in claim 11, in which said additional organic polymer means is formed by low pressure chemical vapor deposition.

17. The apparatus as claimed in claim 11, in which said additional organic polymer means is cured, liquid, organic polymer.

18. An apparatus comprising:
   a package; said package having a bonding contact and a cavity area;
   an integrated circuit; said integrated circuit, having a contact, and being positioned within said cavity area of said package;
   a layer of a non-conducting organic polymer; said layer bridging said bonding contact of said package, and said contact of said integrated circuit; and
   a conductive path; said conductive path being located within said layer and extending from said bonding contact of said package to said contact of said integrated circuit.

19. The apparatus as claimed in claim 18, in which said non-conducting organic polymer is polyaniline.

20. The apparatus as claimed in claim 18, in which said non-conducting organic polymer is selected from the group consisting of polypyrrole, polythiophene, polyacetylene, poly (p-phenylene-sulfide), and (2,6-dimethylphenylene-oxide).

21. The apparatus as claimed in claim 18, in which said conductive path in said layer is formed by chemical doping.

22. The apparatus as claimed in claim 18, in which said conductive path in said layer is formed by focused ion beam doping.

23. The apparatus as claimed in claim 18 in which said conductive path in said layer is formed by direct ion beam doping.

24. The apparatus as claimed in claim 18, in which said layer is electrochemically deposited.

25. The apparatus as claimed in claim 18, in which said layer is formed by low pressure chemical vapor deposition.

26. The apparatus as claimed in claim 18, in which said layer is a cured, liquid, organic polymer.

27. The apparatus as claimed in claim 18, further comprising a cover attached to said package for protection of said integrated circuit, said package and said layer.

28. The apparatus as claimed in claim 27, in which said cover is in contact with said layer.

29. The apparatus as claimed in claim 18, further comprising an additional layer of said non-conducting organic polymer, covering said layer.

30. The apparatus as claimed in claim 29, further comprising a cover attached to said package for protection of said integrated circuit, said package, said layer and said additional layer.

31. The apparatus as claimed in claim 30, in which said cover is in contact with said additional layer.

32. The apparatus as claimed in claim 29, in which said additional layer is electrochemically deposited.

33. The apparatus as claimed in claim 29, in which said additional layer is formed by low pressure chemical vapor deposition.

34. The apparatus as claimed in claim 29, in which said additional layer is a cured, liquid, organic polymer.

* * * * *